United States Patent
Dorner-Reisel

(10) Patent No.: US 8,237,333 B2
(45) Date of Patent: Aug. 7, 2012

(54) PIEZOELECTRIC ACTUATOR AND METHOD FOR PRODUCING A PIEZOELECTRIC ACTUATOR

(75) Inventor: Annett Dorner-Reisel, Chemnitz (DE)

(73) Assignee: Continental Automotive GmbH, Hannover (DE)

( * ) Notice: Subject to any disclaimer, the term of this patent is extended or adjusted under 35 U.S.C. 154(b) by 227 days.

(21) Appl. No.: 12/527,621

(22) PCT Filed: Feb. 19, 2008

(86) PCT No.: PCT/EP2008/051984
§ 371 (c)(1),
(2), (4) Date: Jan. 7, 2010

(87) PCT Pub. No.: WO2008/101919
PCT Pub. Date: Aug. 28, 2008

(65) Prior Publication Data
US 2011/0127886 A1      Jun. 2, 2011

(30) Foreign Application Priority Data
Feb. 20, 2007  (DE) .......................... 10 2007 008 266

(51) Int. Cl.
H01L 41/08     (2006.01)
(52) U.S. Cl. ........................................ 310/328; 358/366
(58) Field of Classification Search .................. 310/328, 310/366
See application file for complete search history.

(56) References Cited

U.S. PATENT DOCUMENTS

| | | | |
|---|---|---|---|
| 5,880,552 A * | 3/1999 | McGill et al. | 310/313 R |
| 6,765,337 B1 | 7/2004 | Heinz et al. | 310/328 |
| 6,989,627 B2 * | 1/2006 | Senoo et al. | 310/363 |
| 7,073,265 B2 * | 7/2006 | Senoo et al. | 30/364 |
| 7,498,191 B2 * | 3/2009 | Sung | 438/105 |
| 7,602,105 B2 * | 10/2009 | Auciello | 310/324 |
| 7,808,155 B2 * | 10/2010 | Yamamoto et al. | 310/328 |
| 2006/0076650 A1 | 4/2006 | Osawa | 257/620 |

FOREIGN PATENT DOCUMENTS

| | | |
|---|---|---|
| DE | 19802302 | 7/1999 |
| EP | 1511092 | 3/2005 |
| JP | 2003037308 | 2/2003 |

OTHER PUBLICATIONS

International Search Report and Written Opinion for Application No. PCT/EP2008/051984 (16 pages), Jun. 20, 2008.

* cited by examiner

*Primary Examiner* — Mark Budd
(74) *Attorney, Agent, or Firm* — King & Spalding L.L.P.

(57) ABSTRACT

A fully active piezoelectric stack has alternately successive piezoelectric layers and inner electrodes which pass through to the outer side of the stack and each have a first region, which does not adhere or adheres poorly and a second region which adheres well to the coating. The inner electrodes are provided for the purpose of using their first regions to alternately contact-connect a first outer electrode and a second outer electrode. The outer side of the fully active piezoelectric stack is coated with the coating at least in regions which are assigned the outer electrodes. The coating is then removed in regions which border the first regions of the inner electrodes and the two outer electrodes are applied to the remaining coating, with the result that the outer electrodes contact-connect the first regions of the inner electrodes and the coating is otherwise arranged between the inner electrodes and the outer electrodes.

9 Claims, 7 Drawing Sheets

PIEZOELECTRIC ACTUATOR AND METHOD FOR PRODUCING A PIEZOELECTRIC ACTUATOR

CROSS-REFERENCE TO RELATED APPLICATIONS

This application is a U.S. National Stage Application of International Application No. PCT/EP2008/051984 filed Feb. 19, 2008, which designates the United States of America, and claims priority to German Application No. 10 2007 008 266.7 filed Feb. 20, 2007, the contents of which are hereby incorporated by reference in their entirety.

TECHNICAL FIELD

The invention relates to a fully active piezo actuator and to a method for producing a fully active piezo actuator.

BACKGROUND

Piezo elements are used, inter alia, for positioning elements, ultrasonic transducers, sensors and in inkjet printers. The function of a piezo element is based on the deformation of piezoceramic materials such as, for example, lead-zirconate-titanate, under the action of an electrical field. If an electrical voltage is applied to the piezo element, it expands in the perpendicular direction with respect to the electrical field which is generated (inverse piezo effect).

DE 198 02 302 A1 discloses a multi-layer actuator structure. Such a multilayer actuator is composed of piezoceramic layers and internal electrodes for generating the electrical field. Since a plurality of the piezoceramic layers and internal electrodes are stacked one on top of the other, such an actuator is also referred to as a stack.

The internal electrodes make contact with two external electrodes which are applied to the outer side of the piezo stack, wherein the internal electrodes alternately make contact with just one of the two external electrodes. To make this possible, the internal electrodes are not made to extend as far as the outer side of the piezo stack in the regions in which said internal electrodes are not intended to make contact with the relevant external electrode. These regions are referred to as inactive zones since, when a voltage is applied to the external electrodes, the piezoelectric layers in the inactive zones are not completely penetrated by the electrical field of the internal electrodes and therefore also do not expand or do not expand very much compared to the remaining regions of the piezo stack. This brings about mechanical stresses within the piezo stack, and these damage the piezo stack.

SUMMARY

According to various embodiments, a piezo actuator composed of a piezo stack and a method for producing a piezo actuator from a piezo stack can be specified, in which method mechanical stresses during the operation of the piezo actuator are substantially reduced.

According to an embodiment, a method for producing a piezo actuator, may have the following method steps:—provision of a fully active piezo stack, which has alternately successive piezoelectric layers and internal electrodes which penetrate as far as the outer side of the piezo stack and each have a first region which adheres poorly, or does not adhere, to a coating, and a second region which adheres well to the coating, wherein the internal electrodes are provided for alternately making contact with a first external electrode and a second external electrode of the piezo actuator, with their first regions,—complete coating of the outer side of the fully active piezo stack with the coating at least in regions to which the external electrodes of the piezo actuator are assigned,—removal of the coating in regions which adjoin the first regions of the internal electrodes, and—application of the two external electrodes to the coating, with the result that the external electrodes make contact with the first regions of the internal electrodes and otherwise the coating is arranged between the internal electrodes and the external electrodes.

According to a further embodiment, the piezo stack which is provided can be produced by alternately stacking at least two partial stacks, wherein each of the partial stacks has a piezoelectric layer and an internal electrode arranged thereon. According to a further embodiment, the method may further comprise the steps of blowing off, oxidizing and/or rinsing away coating residues of the removed coating from the piezo stack. According to a further embodiment, the first and second regions of alternately successive internal electrodes may be respectively rotated through 180° with respect to one another. According to a further embodiment, the internal electrodes may have, in their second regions, a material which is embodied as a carbide former. According to a further embodiment, the internal electrodes can be produced by providing the piezoelectric layers with at least two different electrode pastes, a first electrode paste of which is assigned to the first region and provides poor adhesion, or no adhesion, to the coating, and a second electrode paste is assigned to the second region and provides good adhesion to the coating. According to a further embodiment, the internal electrodes may have copper. According to a further embodiment, the coating may have an amorphous structure and is, in particular, a DLC layer or a carbon-based layer. According to a further embodiment, the external electrodes can be arranged on two opposite outer sides of the piezo stack.

According to another embodiment, a piezo actuator may have—first and second external electrodes,—a fully active piezo stack which has alternately successive piezoelectric layers and internal electrodes which penetrate as far as the outer side of the piezo stack and each have a first region which adheres poorly, or does not adhere, to a coating, and a second region which adheres well to the coating, wherein the internal electrodes alternately make contact with the first external electrode and the second external electrode, with their first regions, and—a coating which is arranged on the outer side of the piezo stack and to which the external electrodes are applied and which is removed in regions in which the external electrodes make contact with the internal electrodes, with the result that the external electrodes make contact with the first regions of the internal electrodes, and otherwise the coating is arranged between the internal electrodes and the external electrodes.

According to a further embodiment, the first and second regions of alternately successive internal electrodes can be respectively rotated through 180° with respect to one another. According to a further embodiment, the internal electrodes may have, in their second regions, a material which is embodied as a carbide former. According to a further embodiment, the internal electrodes can be embodied as at least two different electrode pastes with which the piezoelectric layers are provided, a first electrode paste of which electrode pastes is assigned to the first region and provides poor adhesion, or no adhesion, to the coating, and a second electrode paste of which electrode pastes is assigned to the second region and provides good adhesion to the coating. According to a further embodiment, the internal electrodes may have copper. According to a further embodiment, the coating can be a thin layer or thick layer and/or has an amorphous, nano-crystalline or crystalline structure and/or is, in particular, an amorphous, nano-crystalline DLC layer or carbon-based layer. According to a further embodiment, the external electrodes can be arranged on two opposite outer sides of the piezo stack.

BRIEF DESCRIPTION OF THE DRAWINGS

An exemplary embodiment is explained in exemplary form in the appended schematic drawings, in which.

DETAILED DESCRIPTION

Figure 1:
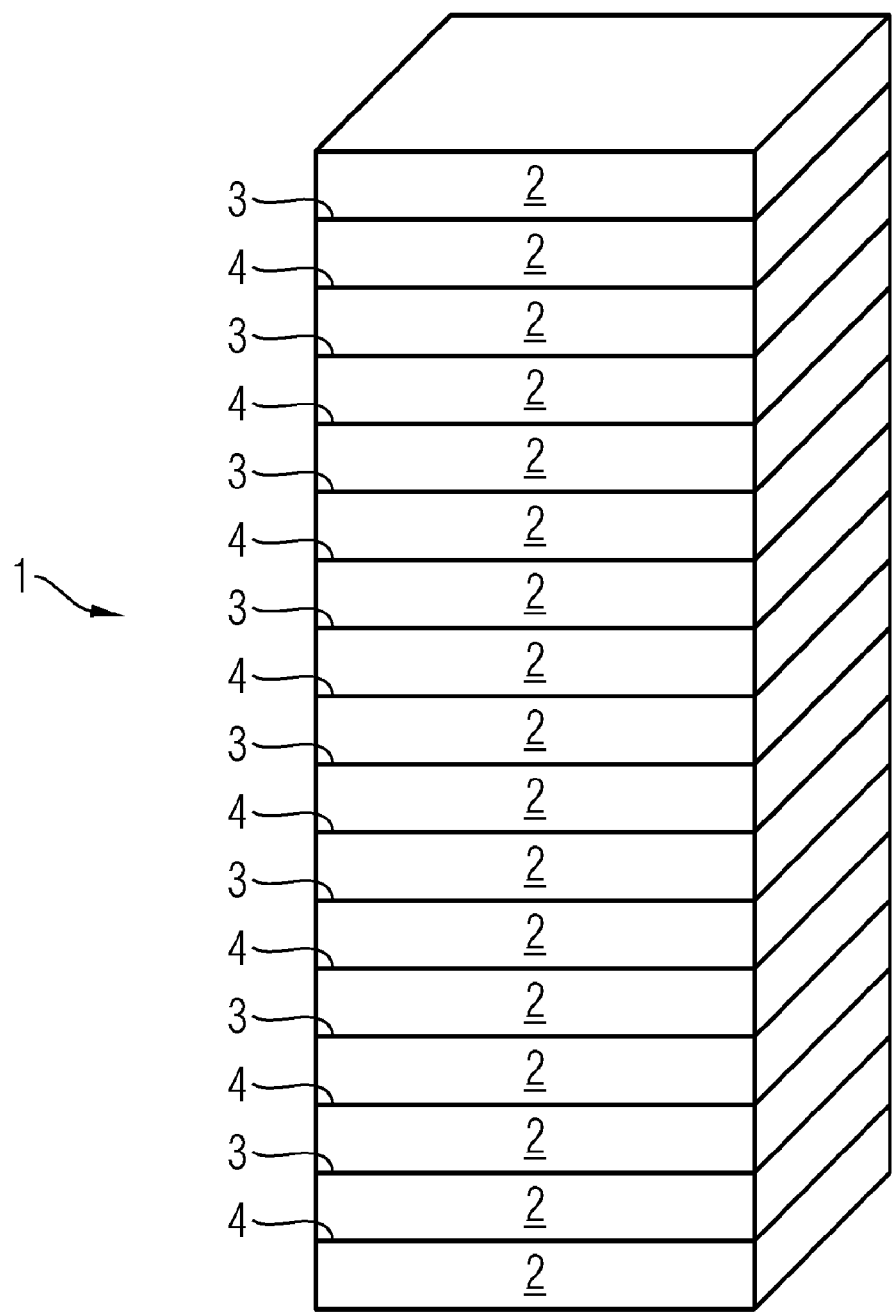
FIG. 1 shows a perspective side view of a fully active piezo stack.

According to various embodiments, a method for producing a fully active piezo actuator, may have the following method steps:

provision of a fully active piezo stack, which has alternately successive piezoelectric layers and internal electrodes which penetrate as far as the outer side of the piezo stack and each have a first region which adheres poorly, or does not adhere, to a coating, and a second region which adheres well to the coating, wherein the internal electrodes are provided for alternately making contact with a first external electrode and a second external electrode of the piezo actuator, with their first regions, complete coating of the outer side of the fully active ceramic piezo stack with the coating at least in regions to which the external electrodes of the piezo actuator are assigned, removal of the coating in regions which adjoin the first regions of the internal electrodes, and application of the two external electrodes to the coating, with the result that the external electrodes make contact with the first regions of the internal electrodes and otherwise the coating is arranged between the internal electrodes and the external electrodes.

According to other embodiments, a piezo actuator may have first and second external electrodes, a fully active piezo stack which has alternately successive piezoelectric layers and internal electrodes which penetrate as far as the outer side of the piezo stack and each have a first region which adheres poorly, or does not adhere, to a coating, and a second region which adheres well to the coating, wherein the internal electrodes alternately make contact with the first and second external electrodes, with their first regions, and a coating which is arranged on the outer side of the piezo stack and to which the external electrodes are applied and which is removed in regions in which the external electrodes make contact with the internal electrodes, with the result that the external electrodes make contact with the first regions of the internal electrodes, and otherwise the coating is arranged between the internal electrodes and the external electrodes.

A fully active piezo stack is used for the method and for the piezo actuator according to various embodiments. The internal electrodes of a fully active piezo stack are continuous, i.e. they extend over the entire cross-sectional area of the piezo stack. As a result of this configuration, all of the internal electrodes extend as far as the outer side of the piezo stack, for which reason it does not have any inactive zones. As a result, the level of the mechanical stresses within the piezo stack during operation is reduced.

The piezo stack which is provided is produced, for example, by alternately stacking at least two partial stacks, wherein each of the partial stacks has a piezoelectric layer and an internal electrode arranged thereon. The piezo stack which is produced is manufactured here, in particular, by printing what are referred to as green ceramic films with metallic pastes using, for example, a screen printing method. The metallic pastes have, for example, AgPd or Cu particles, solvents and further additives. Then, typically approximately 300 to 600 green ceramic films which are provided with the paste are laid one top of the other and processed by pressing to form what is referred to as a green block. Approximately 100 individual fully active piezo stacks of a size of approximately 36 mm×9 mm×9 mm can be cut out of a green block of, for example, a size of approximately 36 mm×105 mm×105 mm. After debinding and sintering, the piezoelectric layers are then produced from the green ceramic films, and the internal electrodes are produced from the pastes.

Difficulties arise in the use of a fully active piezo stack with respect to the reliable alternating formation of contact between the internal electrodes and the external electrodes since, of course, all the internal electrodes are made to extend as far as the outer side of the piezo stack and technologically complex removal of the coating on every second internal electrode is costly.

According to various embodiments, the outer side is coated completely in the regions which are assigned to the external electrodes. This coating may be embodied, in particular, so as to be relatively thin, for example in the range between 0.1 and 5 µm.

So that the internal electrodes reliably make contact with the two external electrodes in an alternating fashion, according to various embodiments the coating does not adhere in certain regions, or at least adheres only relatively poorly. These regions are the first regions of the internal electrodes with which contact is to be subsequently made.

In contrast, in the second region of the internal electrodes, the coating adheres well. It is therefore possible for the coating to be removed relatively easily from the first region of the internal electrodes, or the coating peels off automatically. In addition, peeled-off coating residues can be blown off, oxidized or rinsed away.

As a result of the preferably automatic peeling off of the coating in the relevant regions, the conductive internal electrodes composed of the material which adheres poorly, or does not adhere, to the coating, are exposed there and they can subsequently be placed in contact with the external electrodes.

The external electrodes are applied, for example, by applying a metallic paste, for example using a screen printing method.

Other methods are also conceivable. For example, the external electrodes can also be applied to the coating by carrying out conductive external metallization by means of deposition processes out of the gas phase, in which case, similarly to the production of mass-produced components for microelectronics, covering masks are used for the regions of the piezo stack which are not intended to be provided with the external metallization.

This variant of the method according to an embodiment is distinguished by cost-effective and reliable production of the piezo actuator.

If, according to one embodiment of the method or of the piezo actuator, the two external electrodes are arranged on two opposite outer sides of the piezo stack, it is then possible to produce the piezo actuator according to an embodiment easily by the first and second regions of alternately successive internal electrodes being respectively rotated through 180° with respect to one another.

The coating has, for example, an amorphous structure and is, in particular, a DLC layer. What is referred to as a DLC ("Diamond-like carbon") layer is a carbon-based layer which can be deposited onto the outer side of the piezo stack using, for example PVD or CVD methods. DLC layers have an amorphous structure with states of order in the nanometer range and are also referred to as a-C ("amorphous carbon") layers. Apart from carbon they can also contain hydrogen and are then also referred to as a-C:H ("amorphous carbon hydrogen") layers.

DLC layers are thin layers with layer thicknesses in the region of less than 10 μm, generally approximately between 0.1 μm and 5 μm. For the amorphous structure to be formed, the coating which is embodied as a DLC layer is subjected, for example, to relatively high cooling rates and bombarded with energy-rich particles. The bombardment with particles results in internal compressive stresses, and in this way the diamond-like binding components composed of $sp^3$-hybridized C—C bonds, which give their name to the DLC layer, come about. In addition, $sp^3$-hybridized C—C bonds can occur in various arrangements, for example cyclical or linear formations of different sizes in an amorphous $sp^3$-hybridized C—C matrix. If the DLC layer additionally contains hydrogen, the coating also has $sp^2/sp^3$-hybridized C—H proportions which, starting from a specific proportion of hydrogen, give rise to softer, less dense DLC layers.

One advantage of DLC layers is that they have a relatively high resistance to wear owing to their proportion of diamond-like $sp^3$-hybridized C—C bonds.

Amorphous layers with a relatively small, or even no, $sp^2$-hybridized C—C cluster in the short-range order region have a relatively high insulation resistance. Such DLC layers are categorized as ceramic or glassy materials. Since the coating is, on the one hand, intended to electrically insulate the internal electrodes from the external electrodes, the structure of the DLC layer must be suitably selected. In particular, DLC layers can be checked by Raman spectroscopy (non-damaging checking suitable for large-series production).

Layers which are based on carbon have good adhesion to carbide formers because they have a high degree of affinity with carbon. According to one variant of the method or of the piezo actuator, the internal electrodes therefore have, in their second regions, a material which is embodied as a carbide former. Suitable elements for carbide formers are, for example, titanium and silicon, which are also frequently used as adhesion-promoting agents on substrates which are difficult to coat.

Materials which are not carbide formers cannot be coated as well or even cannot be coated at all. For example, Cu substrates cannot be coated in a firmly adhering fashion with the PE-CVD method of direct current discharge. The internal electrodes can therefore be copper-based internal electrodes in their first regions.

According to one embodiment of the method, the internal electrodes are produced by providing the piezoelectric layers with at least two different electrode pastes, a first electrode paste of which is assigned to the first region and provides poor adhesion, or no adhesion, to the coating, and a second electrode paste is assigned to the second region and provides good adhesion to the coating.

The method according to various embodiments allows a piezo actuator to be produced from a fully active piezo stack in a cost-effective way. Owing to the use of the fully active piezo stack for the piezo actuator according to various embodiments, fewer mechanical stresses occur during the operation of the piezo actuator compared to conventional piezo actuators with conventional piezo stacks having inactive zones. As a result, preconditions for a substantially longer service life of the piezo actuator according to various embodiments are met.

Figure 2:
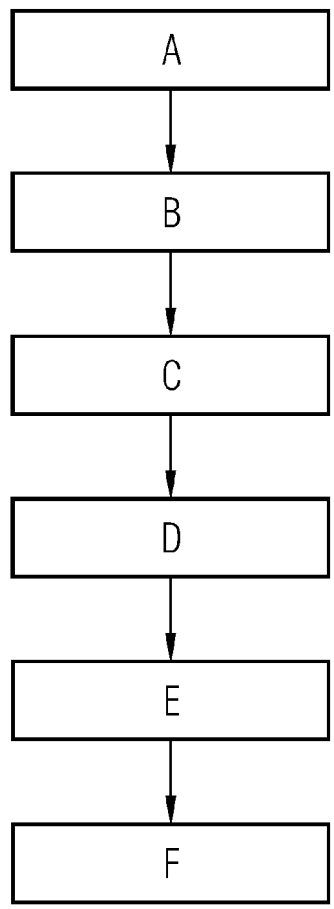
FIG. 2 shows a flowchart illustrating the production of the piezo stack and its further processing.
Figure 9:
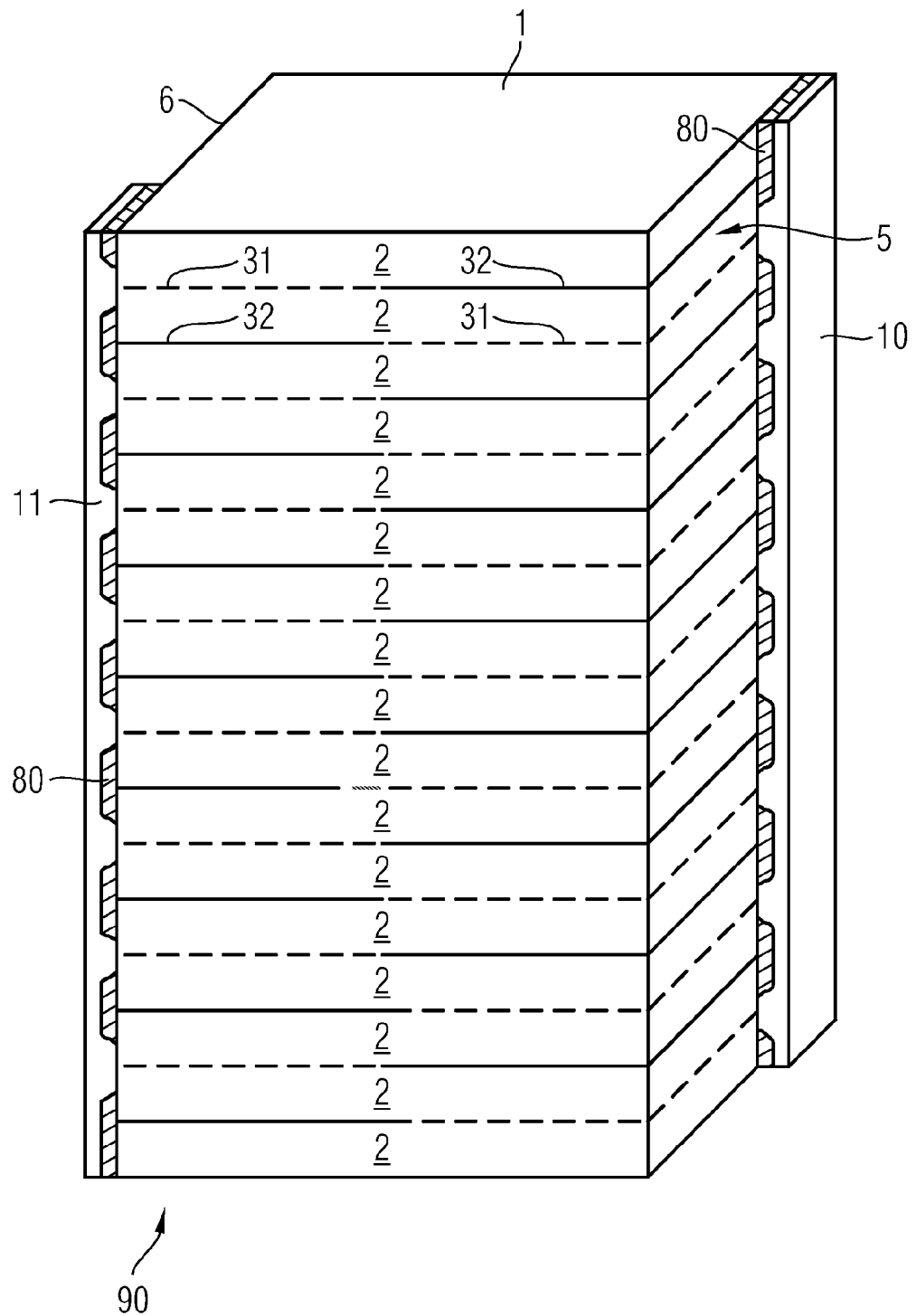
FIG. 9 shows the fully active piezo stack with additional external electrodes.

FIG. 1 shows a fully active piezo stack 1 which is embodied in the form of a right parallelepiped in the case of the present exemplary embodiment and is intended to be processed further to form a piezo actuator 90 shown in FIGS. 9, and FIG. 2 shows a flowchart illustrating the production of the piezo stack 1 and its further processing.

Figure 3:
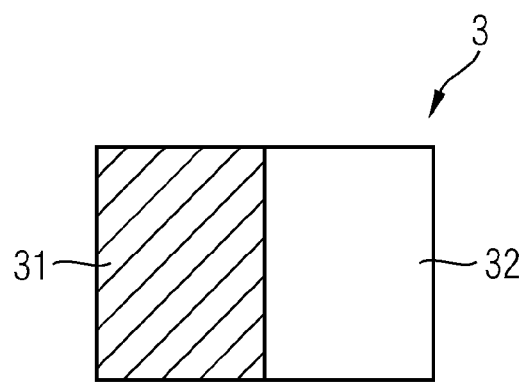
FIG. 3 shows a plan view of an internal electrode of the piezo stack.
Figure 4:
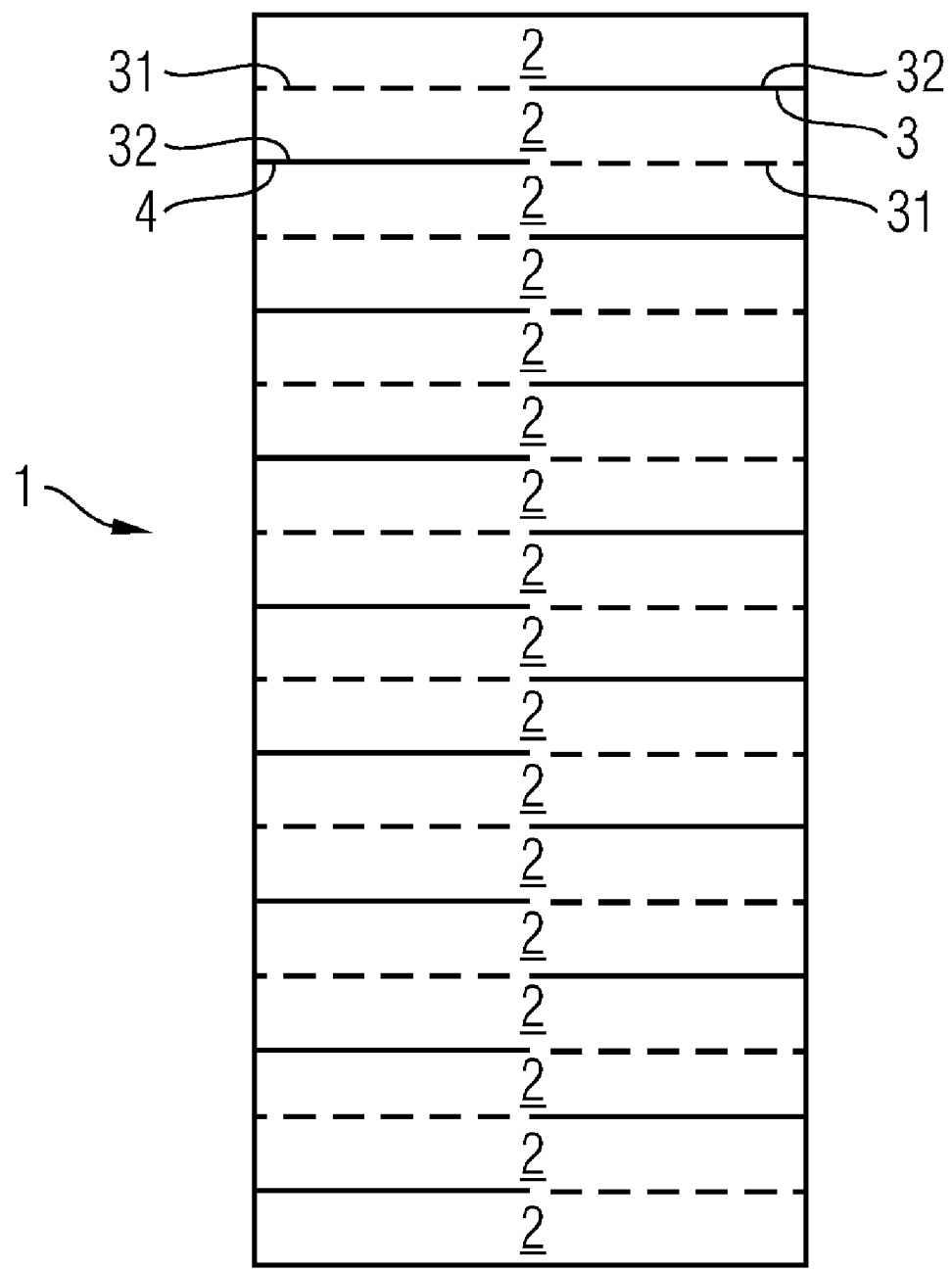
FIG. 4 shows a lateral section through the piezo stack.

The piezo stack 1 has a plurality of piezoelectric layers 2, between which one internal electrode 3, 4 is respectively arranged. The internal electrodes 3, 4 are of continuous design and extend as far as the outer sides of the piezo stack 1. A plan view of an internal electrode 3 is illustrated in FIG. 3, and a lateral section through the piezo stack 1 is illustrated in FIG. 4. The internal electrodes 4 are essentially of precisely the same design as the internal electrodes 3, but in the case of the present exemplary embodiment they are rotated through 180° with respect to the internal electrodes 3.

In the case of the present exemplary embodiment, each of the internal electrodes 3, 4 has respective first and second regions 31, 32, wherein the first region 31 is composed of a material to which the described coating adheres relatively poorly, or does not adhere at all, and the second region 32 has a material to which this coating adheres relatively well.

Figure 5:
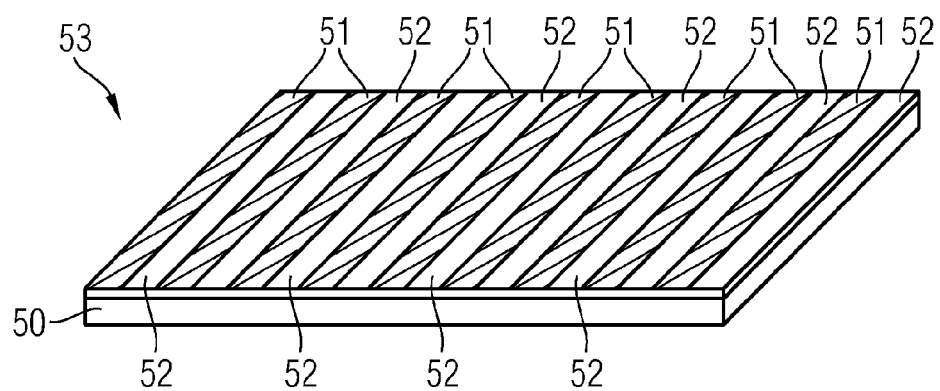
FIGS. 5, 6 show intermediate steps during the production of the piezo stack.

In the case of the present exemplary embodiment, the fully active piezo stack 1 is produced as follows:

Firstly, first and second pastes 51, 52 are successively applied in strip shapes to what is referred to as a green ceramic film 50 (illustrated in FIG. 5) with, for example, a cross-sectional area of 105 mm×105 mm, for example using a screen printing method with an intermediate drying step, step A of the flowchart in FIG. 2, as a result of which a partial green block 53 is produced.

In the case of the present exemplary embodiment, the first paste 51 has copper particles, and the second paste 52 has, in addition to electrically conductive particles, for example copper particles, carbide formers such as, for example, titanium or silicon in the form of microscopically finely distributed particles or as submicroscopically finely distributed precursors. In addition, the pastes 51, 52 are applied to the green ceramic film 50 in such a way that one of the sides is closed off with one of the first pastes 51, and the side lying opposite thereto is closed off with one of the second pastes 52. The internal electrodes 3, 4 are produced from the pastes 51, 52 in the course of the manufacturing process of the piezo stack 1, wherein the first paste 51 is assigned to the first regions 31, and the second paste 52 is assigned to the second regions 32 of the internal electrodes 3, 4.

Figure 6:
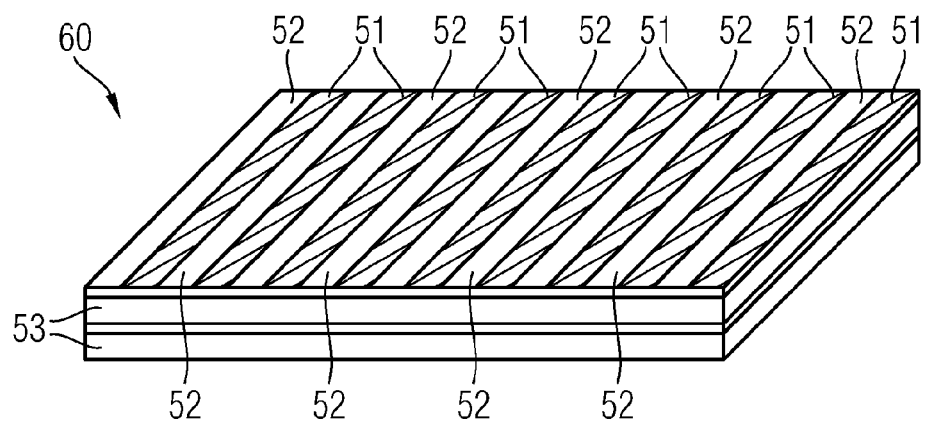

A plurality, for example 300 to 600 of the ceramic films 50 (partial green block 53) which are provided with the pastes 51, 52 are then stacked one on top of the other and pressed, as a result of which a green block 60 (illustrated only partially in FIG. 6) is produced, step B of the flowchart. The green block 60 which is illustrated partially in FIG. 6 has two partial green blocks 53 lying one on top of the other, wherein, in the case of the present exemplary embodiment, the individual partial green blocks 53 are rotated alternately through, in each case, 180° with respect to a subsequent partial green block 53.

A plurality of fully active green stacks are then cut out of the green block 60 and the fully active piezo stacks 1 are produced therefrom by debinding and sintering, i.e. the green films 50 yield the piezoelectric layers 2, and the pastes 51, yield the internal electrodes 3, 4, step C of the flowchart.

The piezo stack 1 which has been produced in this way accordingly has alternating internal electrodes 3, 4 on, in each case, two outer sides 5, 6 lying opposite one another, wherein a first region 31 which adheres poorly, or does not adhere, and a second region 32 which adheres well, of the internal electrodes 31, 32 alternately adjoin the outer sides.

Figure 7:
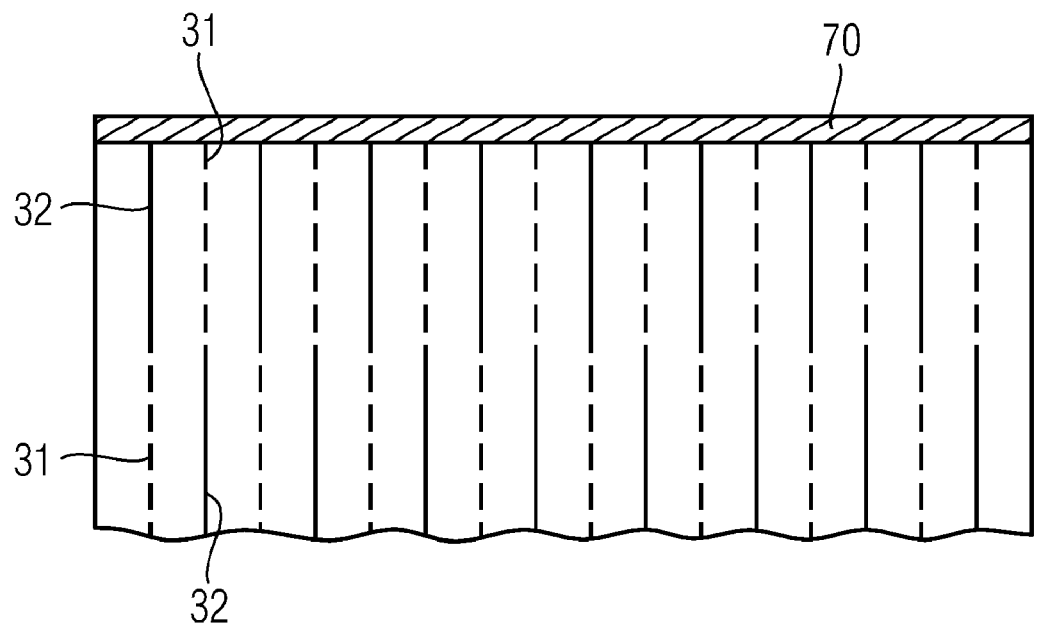
FIG. 7 shows a partial lateral section of the piezo stack provided with a coating.

The piezo stack 1 is then provided with a complete coating 70 (shown in FIG. 7), at least in regions of the outer sides 5, 6 which are provided with the external electrodes in a production step described further below, step D of the flowchart.

In the present exemplary embodiment, the coating 70 is an amorphous or nanocrystalline or crystalline layer or, in particular, a carbon-based thin layer, a DLC layer, which has been generated, for example, by means of a PE-CVD method of DC plasma decomposition from a precursor $C_2H_2$ or $CH_4$ and has, in particular, a thickness of 0.1 to 5 μm.

Since the second regions 32 of the internal electrodes 3, 4 are obtained from the pastes 52 provided with the carbide formers, the coating 70 adheres well in regions of the outer sides 5, 6 which are assigned to the second regions 32 of the internal electrodes 3, 4.

Figure 8:
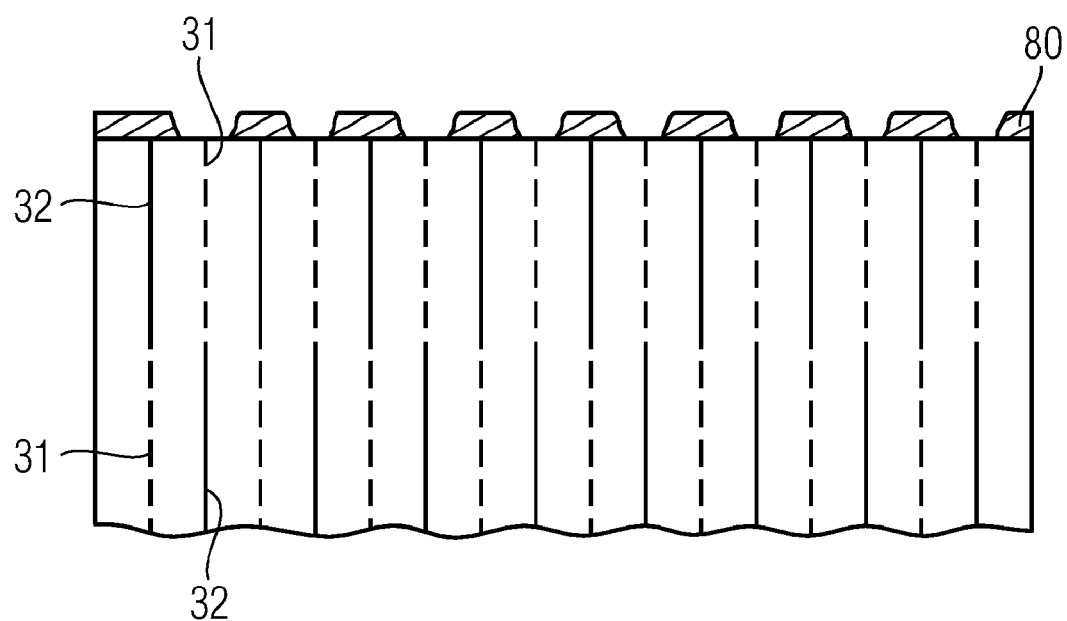
FIG. 8 shows a partial lateral section through the coated piezo stack after treatment.

In contrast, the coating 70 adheres poorly or even not at all in regions of the outer sides 5, 6 which are assigned to the first regions 31 of the internal electrodes 3, 4, as a result of which the coating 70 peels off in these regions, step E of the flowchart. Residues of the peeled-off coating 70 can be blown off, rinsed away or oxidized, or the blowing off or rinsing away can ensure that improved peeling off occurs. As a result, a piezo stack 1, which is shown in a partial side view in FIG. 8, which has a treated coating 80 and in which, on the one hand, on each of the two outer sides 5, 6 in the regions of the coating 80 an internal electrode 3, 4 is alternately exposed or covered by the coating 80, and, on the other hand, a specific internal electrode of the internal electrodes 3, 4 is exposed in the region of the coating 80 on one of the outer sides 5, 6 and is covered by the coating 80 on the outer side 5, 6 lying opposite.

The coatings 80 are subsequently satisfactorily provided, for example using a screen printing method, with an electrically conductive paste which coatings form the external electrodes 10, 11, step F of the flowchart. Owing to the coating 80, the external electrodes 10, 11 make contact with only every second internal electrode 3, 4, specifically in the first regions 31 in which the coating 70 has been removed owing to the poor adhesion.

Figure 10:
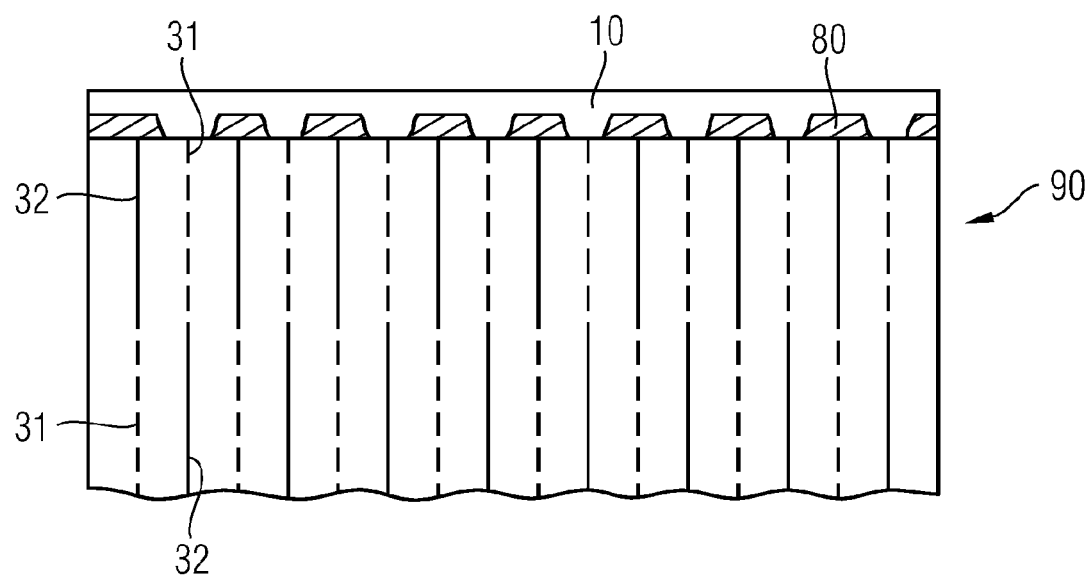
FIG. 10 shows a partial lateral section through the piezo stack which is provided with external electrodes.

This produces a piezo actuator 90 (illustrated in FIGS. 9 and 10) which has the piezo stack 1 with coatings 80 provided on its outer sides 5, 6, wherein the coatings 80 do not adhere in regions assigned to the first regions 31 of the internal electrodes 3, 4, with the result that the external electrodes 10, 11 which are applied to the coating 80 make contact with the internal electrodes 3, 4 in an alternating fashion.

What is claimed is:

1. A piezo actuator comprising first and second external electrodes,
    a fully active piezo stack which has alternately successive piezoelectric layers and internal electrodes which penetrate as far as the outer side of the piezo stack and each have a first region not comprising carbide formers, such that the coating adheres poorly, or does not adhere, to the first region and a second region comprising carbide formers such that the coating adheres well to the second region,
    wherein the internal electrodes alternately make contact with the first external electrode and the second external electrode, with their first regions, and
    a coating which is arranged on the outer side of the piezo stack and to which the external electrodes are applied and which is removed in regions in which the external electrodes make contact with the internal electrodes, with the result that the external electrodes make contact with the first regions of the internal electrodes, and otherwise the coating is arranged between the internal electrodes and the external electrodes.

2. The piezo actuator according to claim 1, wherein the first and second regions of alternately successive internal electrodes are respectively rotated through 180° with respect to one another.

3. The piezo actuator according to claim 1, wherein the internal electrodes are embodied as at least two different electrode pastes with which the piezoelectric layers are provided, a first electrode paste of which electrode pastes is assigned to the first region and provides poor adhesion, or no adhesion, to the coating, and a second electrode paste of which electrode pastes is assigned to the second region and provides good adhesion to the coating.

4. The piezo actuator according to claim 1, wherein the internal electrodes have copper.

5. The piezo actuator according to claim 1, wherein the coating is a thin layer or thick layer and/or has an amorphous, nano-crystalline or crystalline structure and/or is, in particular, an amorphous, nano-crystalline DLC layer or carbon-based layer.

6. The piezo actuator according to claim 1, wherein the external electrodes are arranged on two opposite outer sides of the piezo stack.

7. The piezo actuator according to claim 1, wherein the coating has an amorphous structure.

8. The piezo actuator according to claim 7, wherein the coating is a DLC layer or a carbon-based layer.

9. The piezo actuator according to claim 3, wherein the second electrode paste includes titanium or silicon carbide formers to which the carbon coating adheres well.

* * * * *